United States Patent
Heng

(10) Patent No.: US 9,679,832 B1
(45) Date of Patent: Jun. 13, 2017

(54) ROUGH LEADFRAME WITH A NANOLAYER OF SILVER

(71) Applicant: STMICROELECTRONICS SDN BHD, Muar (MY)

(72) Inventor: Yh Heng, Muar (MY)

(73) Assignee: STMICROELECTRONICS SDN BHD, Muar (MY)

( * ) Notice: Subject to any disclaimer, the term of this patent is extended or adjusted under 35 U.S.C. 154(b) by 0 days.

(21) Appl. No.: 15/215,359

(22) Filed: Jul. 20, 2016

(51) Int. Cl.
*H01L 23/495* (2006.01)
*H01L 21/50* (2006.01)
*H01L 21/48* (2006.01)
*H01L 23/31* (2006.01)
*H01L 21/56* (2006.01)

(52) U.S. Cl.
CPC .... *H01L 23/49513* (2013.01); *H01L 21/4825* (2013.01); *H01L 21/565* (2013.01); *H01L 23/3114* (2013.01); *H01L 23/4952* (2013.01); *H01L 23/49548* (2013.01); *H01L 23/49582* (2013.01)

(58) Field of Classification Search
CPC ......... H01L 23/49582; H01L 23/49513; H01L 21/563; H01L 23/4952
USPC .......................................... 257/676; 438/123
See application file for complete search history.

(56) References Cited

U.S. PATENT DOCUMENTS

| | | | | |
|---|---|---|---|---|
| 7,049,683 B1* | 5/2006 | Sirinorakul | ......... | H01L 21/4835 257/666 |
| 7,190,057 B2* | 3/2007 | Seki | ......... | C25D 5/02 257/678 |
| 8,367,479 B2* | 2/2013 | Nakamura | ......... | H01L 21/4828 257/E21.506 |
| 8,420,446 B2* | 4/2013 | Yo | ......... | C25D 5/12 257/E21.505 |
| 2015/0001697 A1* | 1/2015 | Heng | ......... | H01L 23/49575 257/676 |

* cited by examiner

*Primary Examiner* — Luan C Thai
(74) *Attorney, Agent, or Firm* — Seed IP Law Group LLP

(57) ABSTRACT

One or more embodiments are directed to leadframes and leadframe semiconductor packages. One embodiment is directed to copper leadframes with one or more die pads and one more leads with a roughened surface. Covering the roughened surface of the die pad of the leadframe is nanolayer of Silver (Ag). The thickness of the nanolayer preferably has a thickness that corresponds to the roughened surface of the copper leadframe. For instance, in one embodiment, the copper leadframe is roughened to have peaks and valleys that approximately average 10 nanometers and the thickness of the nanolayer is 10 nanometers. Covering a portion of the nanolayer of Ag is a microlayer of Ag, which provides a suitable bonding surface for coupling a semiconductor die to the die pad by an adhesive material.

20 Claims, 5 Drawing Sheets

ROUGH LEADFRAME WITH A NANOLAYER OF SILVER

BACKGROUND

Technical Field

Embodiments of the present disclosure are directed to leadframe packages and methods of making same.

Description of the Related Art

Leadframe packages are widely used in the semiconductor industry and, in general, provide low cost solutions with relatively straight forward assembly processing. There remain, however, various obstacles for maintaining suitable adhesion between some materials within leadframe packages.

To improve adhesion to a leadframe, one or more surfaces of leadframe may be roughened. In that regard, materials, such as adhesives and encapsulants may better adhere to the surface of the leadframe during assembly processing.

Unfortunately, however, the roughened surface of the leadframes also increases the wettability of the surface. Thus, adhesive materials used to couple a semiconductor die or chip to a roughened surface of a leadframe may flow or bleed on the roughened surface of the leadframe due to capillary effects caused by the roughened surface. Furthermore, some adhesive materials that are able to withstand thermal cycling without cracking may more readily bleed or flow on the roughened surface of the leadframe.

Thus, there is a desire to improve adhesion between the components of a semiconductor package and a leadframe of the package.

BRIEF SUMMARY

One or more embodiments are directed to leadframes and leadframe semiconductor packages. One embodiment is directed to copper leadframes with one or more die pads and one more leads with a roughened surface. Covering the roughened surface of the die pad of the leadframe is nanolayer of Silver (Ag). The thickness of the nanolayer preferably has a thickness that corresponds to the roughened surface of the copper leadframe. For instance, in one embodiment, the copper leadframe is roughened to have peaks and valleys that approximately average 10 nanometers and the thickness of the nanolayer is 10 nanometers. Covering a portion of the nanolayer of Ag is a microlayer of Ag, which provides a suitable bonding surface for coupling a semiconductor die to the die pad by an adhesive material.

In one embodiment, the adhesive material comprises Lead (Pb), Tin (Sn), and Silver (Ag), such as in a composition of 95.5% Pb, 2% Sn and 2.5% Ag, referred to as soft solder. In one or more embodiments, the nanolayer of Ag reduces or eliminates the solder material from bleeding on the surface of the die pads. This is due, at least in part, to the Pb of the solder material having improved solubility with Ag than it has with the copper material of the leadframe material. In particular, upon the solder material flowing with the Ag of the nanolayer, Pb of the solder material and Ag of the nanolayer form an intermediate compound of PbAg.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

DETAILED DESCRIPTION

It will be appreciated that, although specific embodiments of the present disclosure are described herein for purposes of illustration, various modifications may be made without departing from the spirit and scope of the present disclosure.

In the following description, certain specific details are set forth in order to provide a thorough understanding of various aspects of the disclosed subject matter. However, the disclosed subject matter may be practiced without these specific details. In some instances, well-known structures and methods of semiconductor processing, such as semiconductor power devices, comprising embodiments of the subject matter disclosed herein have not been described in detail to avoid obscuring the descriptions of other aspects of the present disclosure.

Figure 1A:
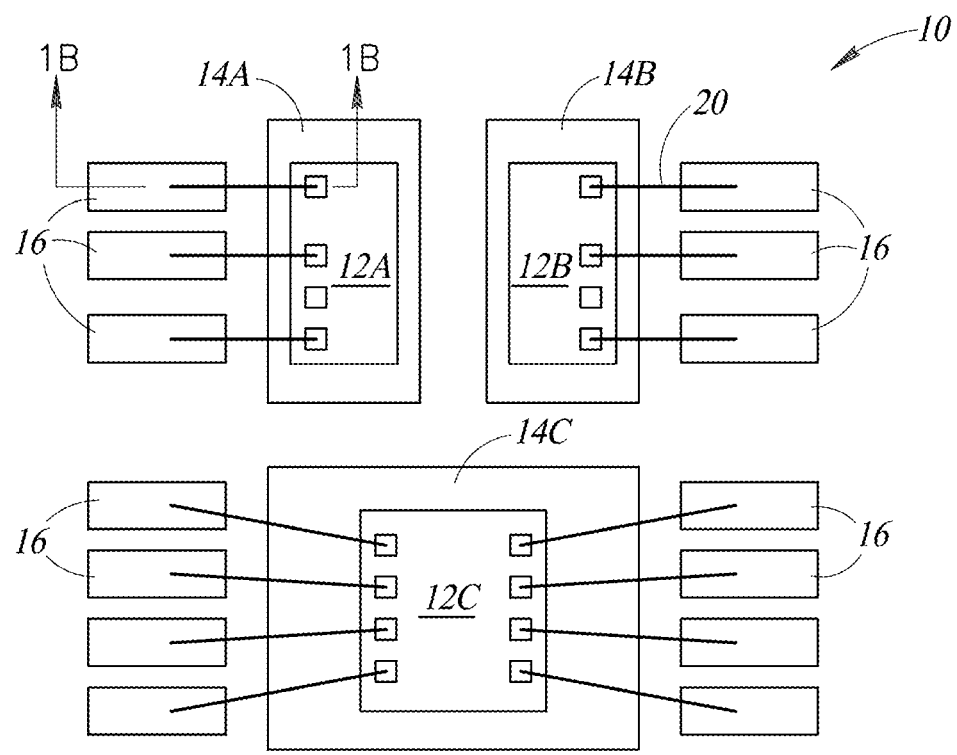
FIG. 1A is a top view of a leadframe package without encapsulation material in accordance with one embodiment.
Figure 1B:
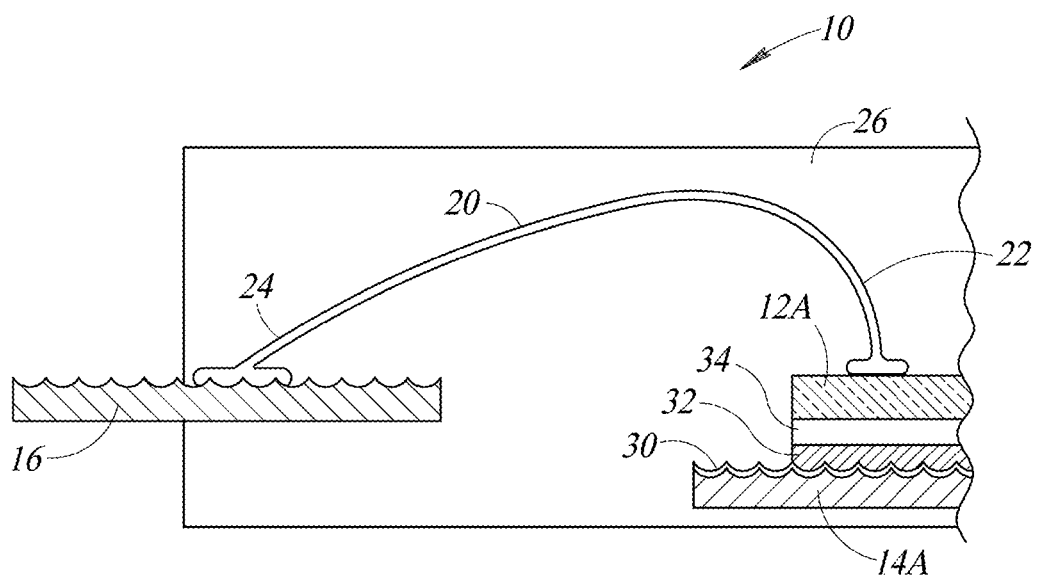
FIG. 1B is a close up cross-section view of a portion of FIG. 1A.

FIG. 1A is a top down view of a semiconductor package without encapsulation material in accordance with one embodiment. FIG. 1B is a partial close-up cross-section view of the semiconductor package of FIG. 1A at the location indicated in FIG. 1A.

As shown in FIG. 1A, the semiconductor package 10 includes semiconductor dice or chips 12, in particular, first, second, and third semiconductor chips 12A, 12B, 12C, bonded to an upper surface of a leadframe. More particularly, the first, second, and third semiconductor dice or chips 12A, 12B, 12C are bonded to upper surfaces of die pads 14, in particular, first, second, and third die pads 14A, 14B, 14C, of a leadframe. The leadframe is made of copper (Cu) or a copper alloy. The leadframe, however, may be made of other conductive materials. As will be explained in more detail below, the leadframe has a roughened upper surface.

Each of the semiconductor chips 12 include one or more electrical components, such as integrated circuits. The integrated circuits may be analog or digital circuits implemented as active devices, passive devices, conductive layers, and dielectric layers formed within the die and electrically interconnected according to the electrical design and function of the chip. In the illustrated embodiment, the first and second chips are power chips and the third chip is a controller. Although the semiconductor package 10 includes three semiconductor chips and three die pads, the semiconductor package may include any number of chips and die pads, including just one chip on a single die pad.

Proximate each die pad 14 is one or more leads 16. The leads 16 are electrically coupled to the semiconductor chips 12 as is well known in the art. In particular, proximate a first side of the first die pad 14A are leads 16, proximate a second side of the second die pad 14B are leads 16, and proximate first and second sides of the third die pad 14C are leads 16. It is to be appreciated that any number of sides of each die pad may include one or more leads and any number of leads may correspond with each die pad.

As mentioned above, the semiconductor chips 12 are electrically coupled to the leads 16. In the illustrated embodiment, conductive wires 20 electrically couple the first, second, and third semiconductor chips 12A, 12B, 12C to respective leads 16. As best shown in FIG. 1B, a first end 22 of a conductive wire 20 is coupled to a die pad of the first semiconductor chip 12A and a second end 24 of the conductive wire 20 is coupled to the lead 16.

Encapsulation material 26 is formed around the electrical components, such as the semiconductor chips 12 and the conductive wires 20. Portions of the leads 16 extend from the encapsulation material 26 and provide external contacts for the package 10. The semiconductor chips 12 inside the package 10 may communicate to electrical components outside of the package 10 through the leads 16, as is well known in the art.

The encapsulation material 26 is an insulating material that protects the electrical components, such as the semiconductor die and conductive wires, from damage, which may include corrosion, physical damage, moisture damage, or other causes of damage to electrical devices and materials. In some embodiments, the encapsulation material 26 is at least one of a polymer, epoxy, resin, polyimide, and silicone.

As mentioned above, at least the upper surface of the die pads 14 and the leads 16 are roughened. In some embodiments, the upper and lower surfaces of the die pads 14 and leads 16 are roughened or the entire leadframe is roughened. In one embodiment, at least some of the peaks and valleys of the roughened surface of the die pads 14 and the leads 16 are greater than 10 microns.

The die pads 14 include a nanolayer 30 of Silver (Ag) over the roughened upper surface. In one embodiment, the nanolayer 30 of Ag is provided over a roughened surface of the copper die pad of the leadframe. The nanolayer 30 of Ag may be over the entire die pad or over a portion of the die pad. For instance, in one embodiment the nanolayer 30 of Ag is on the die pad 14 around a perimeter of the semiconductor chip 12A.

The thickness of the nanolayer 30 preferably has a thickness that corresponds to the roughened surface of the leadframe material. For instance, in one embodiment, the die pads 14 of the copper leadframe is roughened to have peaks and valleys that, on average, are greater than 10 nanometers, and the thickness of the nanolayer 30 of Ag is 10 nanometers. The nanolayer 30 of Ag may be any thickness that is in tens of nanometers, such as less than about 30 nanometers.

In the illustrated embodiment, the leads 16 do not include a nanolayer of Ag. In that regard, the second ends 24 of the conductive wires 20 are coupled directly to the roughened surface of the leads 16.

On the die pads 14, over the nanolayer 30 of Ag, are microlayers 32 of Ag. As best shown in FIG. 1B, the microlayers 32 of Ag are below the semiconductor chips 12. The microlayers 32 of Ag provide a suitable bonding surface for bonding the semiconductor chips 12 with a solder material 34 to the die pads 14. The microlayer 32 of Ag may be any thickness that is in tens of micrometers, such as less than about 30 micrometers. In one embodiment, the microlayer 32 of Ag is about 5-10 microns thick.

FIG. 1B illustrates an enlarged cross-section view of the first semiconductor chip 12A and the die pad 14A, however, it is to be appreciated that the cross-section view is illustrative of the second and third semiconductor chips 12B, 12C and die pads 14B, 14C. As best shown in FIG. 1B, the first semiconductor chip 12A is coupled to the first die pad by solder material 34. In particular, the solder material 34 is located between the first semiconductor chips 12A and the microlayer 32 of Ag on the upper surface of the die pad 14A. The solder material 34 may be any suitable solder material. In one embodiment, the solder material 34 comprises Lead (Pb), Tin (Sn), and Silver (Ag). In one embodiment, the solder material has a composition that is approximately 95.5% Pb, 2% Sn and 2.5% Ag, which will be referred to herein as soft solder. The soft solder is able to withstand thermal cycling, which may occur during the assembly process for forming the package. That is, the soft solder withstands the thermal cycling without cracking.

In one or more embodiments, the nanolayer 30 of Ag reduces or eliminates the solder material 34 from bleeding on the surface of the die pad 14A. This is due, at least in part, to the Pb of the solder material 34 having improved solubility with Ag more than it has with the copper material of the leadframe material. In particular, upon the solder material 34 flowing with the Ag of the nanolayer 30, Pb of the solder material 34 and Ag of the nanolayer 30 form an intermediate compound of PbAg. Furthermore, due to the nanolayer 30 of Ag being so thin over the roughened copper of the leadframe material, the copper of the leadframe is able to improve adhesion for attaching the semiconductor chips to the die pad. It is to be appreciated that although not shown in the Figures, in one or more embodiments the nanolayer 30 of Ag will expose some portions of the leadframe material on the die pad 14 and the leads 16 due to the peaks and valleys of the roughened leadframe. In that regard, the leadframe material, such as copper, provides suitable material for bonding, while the nanolayer of Ag limits bleeding of the solder material. In that regard, die attachment to the die pad is thereby improved.

Figure 2:
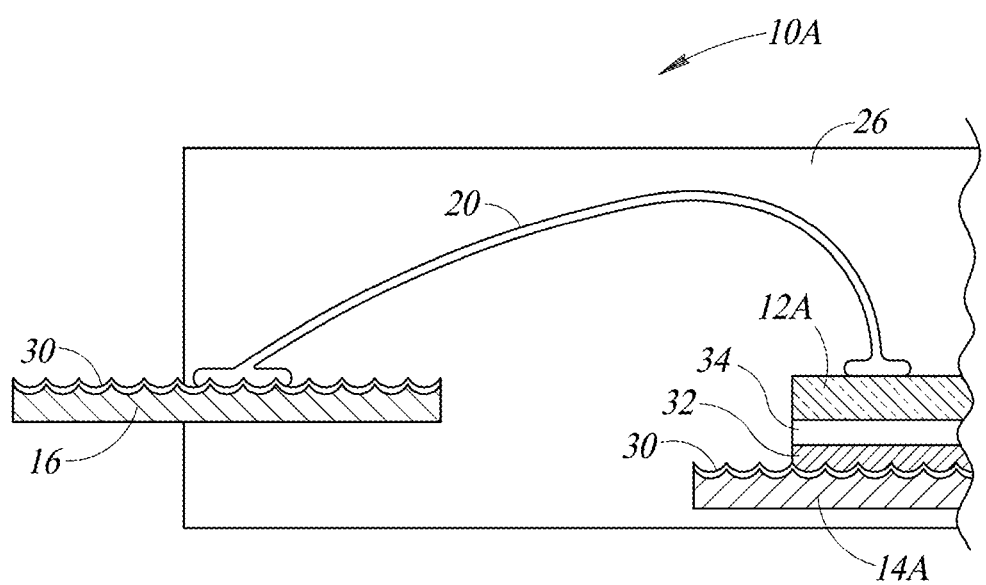
FIG. 2 is a close up cross-section view of a portion of a leadframe package with encapsulation material in accordance with another embodiment.

FIG. 2 illustrates a semiconductor package 10A in accordance with another embodiment. The semiconductor package 10A of FIG. 2 is identical in structure and function to the semiconductor package 10 of FIG. 1 except that the leads 16 include the nanolayer 30 of Ag as well. In that regard the second end 24 of the conductive wire 20 is coupled to the lead 16 at the nanolayer 30 of Ag.

FIGS. 3A-3E illustrate various stages of manufacturing the semiconductor packages, such as semiconductor packages 10 and 10A of FIGS. 1A and 1B, respectively. Although not shown in FIGS. 3A-3E, the leadframe strip includes a plurality of die pads, such as a plurality of sets of first and second die pads 14A, 14B, 14C, and leads that are coupled to together by tie bars, as is well known in the art. In particular, FIGS. 3A-3E illustrate a portion of a leadframe strip or matrix that includes the first and second die pads 14A, 4B and adjacent leads 16. It is, however, to be appreciated that the leadframe would also include the third die pad 14C and corresponding leads 16.

Figure 3A:
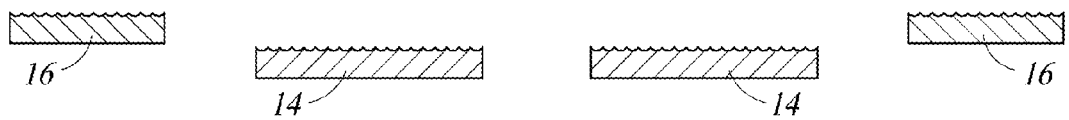
FIGS. 3A-3E are side view illustrating various manufacturing stages for forming the leadframe package of FIGS. 1A and 1B.

FIG. 3A illustrates a step of roughening one or more surfaces of a first and second die pads 14 and leads 16 of a copper or copper alloy leadframe. As mentioned above, the leadframe is a leadframe strip or array that includes many other sets of die pads and leads than are shown.

The copper leadframe is roughened using any suitable technique for roughening copper. In one embodiment, the leadframe is roughened in a plating step. The plating step may include both depositing copper and stripping copper from the leadframe. In another embodiment, the leadframe is roughened by etching the leadframe. As mentioned above, the leads and die pads of the leadframe are roughened so that at least the peaks and valleys of the roughened surface are on average greater than 10 nanometers.

At least upper surfaces of the die pads 14 and leads 16 of the leadframe are roughened. If only portions of the leadframe are roughened, portions of the leadframe not to be roughened may have a mask, such as photoresist, formed thereon prior to the roughening step. In one embodiment, the entire leadframe strip or array is roughened, including the tie bars such that a mask would not have to be formed on the leadframe.

Figure 3B:
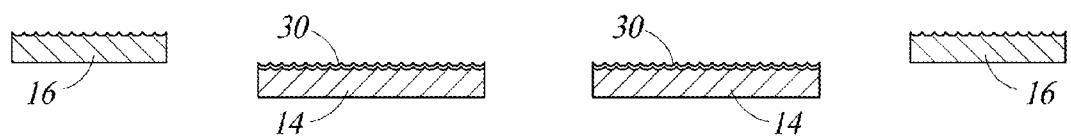

As shown in FIG. 3B, a nanolayer 30 of Ag is formed on the roughened surface of the die pads 14. The nanolayer 30 may be formed on the entire surface of the die pads 14 or at least around a perimeter of portions of the die pads 14 that will be supporting the semiconductor chips which will be coupled thereto in a later step. In one embodiment, the nanolayer 30 of Ag is formed by plating. As mentioned above, the thickness of the nanolayer 30 of Ag corresponds to the roughness of the copper leadframe. Thus, in the embodiment in which one or more (or the average) of the peaks and valleys of the copper leadframe are about 10 nanometers, the nanolayer 30 of Ag is about 10 nanometers. It is to be appreciated that difference between the peaks and valleys and the nanolayer may vary from each other by many nanometers, such as up to about 5 nanometers.

As shown in FIG. 3B, the nanolayer 30 of Ag is not formed on the leads 16. In that regard, prior to forming the nanolayer 30 of Ag, a mask layer, such as a layer of photoresist, is formed on areas of the leadframe strip or matrix not having the nanolayer 30 of Ag formed thereon, such as the leads 16 and the tie bars. After the mask layer is formed, the nanolayer 30 of Ag is plated on the die pads 14, and the masked is removed.

If the semiconductor package 10A of FIG. 2 is being formed, the leads 16 would not have a mask layer formed thereon and the nanolayer 30 of Ag would also be plated on the leads 16.

Figure 3C:
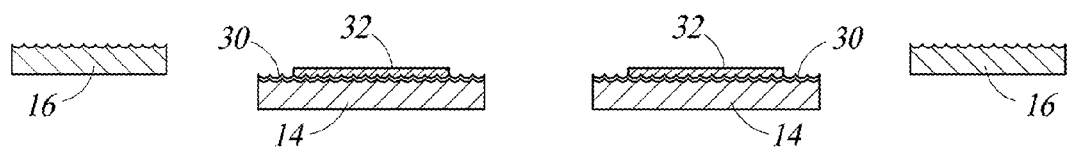

As shown in FIG. 3C, a microlayer 32 of Ag is formed on a portion of the die pads 14 over the nanolayer 30 of Ag. The microlayer 32 of Ag is plated onto the nanolayer 30 of Ag. The nanolayer 30 of Ag and microlayer 32 of Ag are located on the die pad 14 at a location at which the semiconductor chip 12 will be coupled to the die pad 14. An outer perimeter of the die pad 14 remains exposed from the microlayer 32 of Ag. As mentioned above, the thickness of the microlayer 32 of Ag is between about 5-10 microns.

Figure 3D:
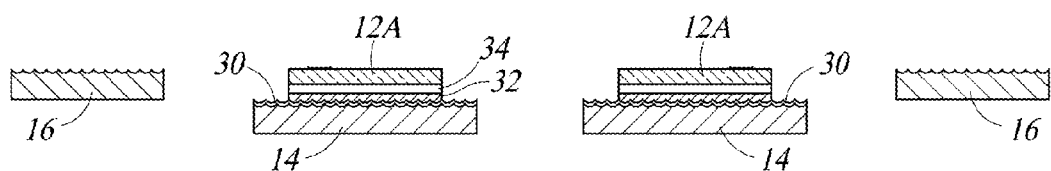

As shown in FIG. 3D, solder material 34 is used to coupled the semiconductor chips 12 to the die pads 14 at the microlayer 32 of Ag. In one embodiment, the solder material 34 is deposited on the microlayer 32 of Ag and the semiconductor chips 12 are placed on the solder material 34. In particular, a pick-and-place tool may be used to place the semiconductor chips 12 on the solder material 34 over the microlayer 32 of Ag. Alternatively, the solder material 34 may be deposited on a back surface of the semiconductor chip 12 or both.

To suitably adhere the semiconductor chip 12 to the die pad 14 at the microlayer 32 of Ag, the process may include a heat treating step. For instance, in one embodiment at this stage the leadframe strip is placed in an oven, which may involve a heated tunnel and conveyor belt, at 360° C. for about one minute or less. During the heating step, the solder material 34 reflows. As the solder material 34 comes into contact with the nanolayer 30 of Ag on the die pad 14, the Pb of the solder material 34 forms an intermediate material with Ag of the nanolayer 30 of Ag.

Figure 4:
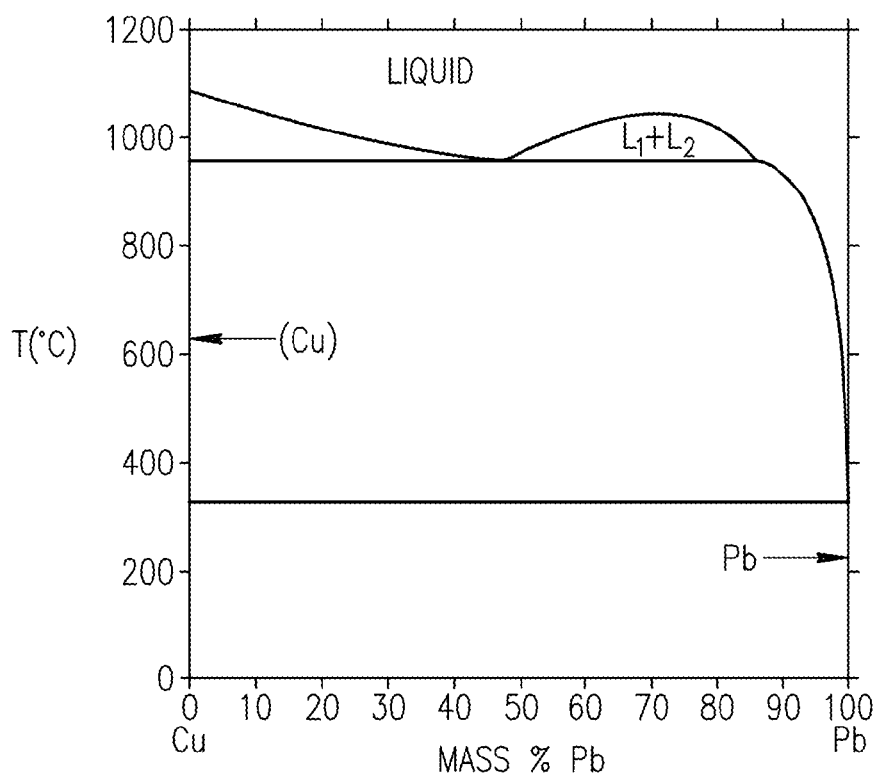
FIG. 4 is a phase diagram of Cu and Pb.
Figure 5:
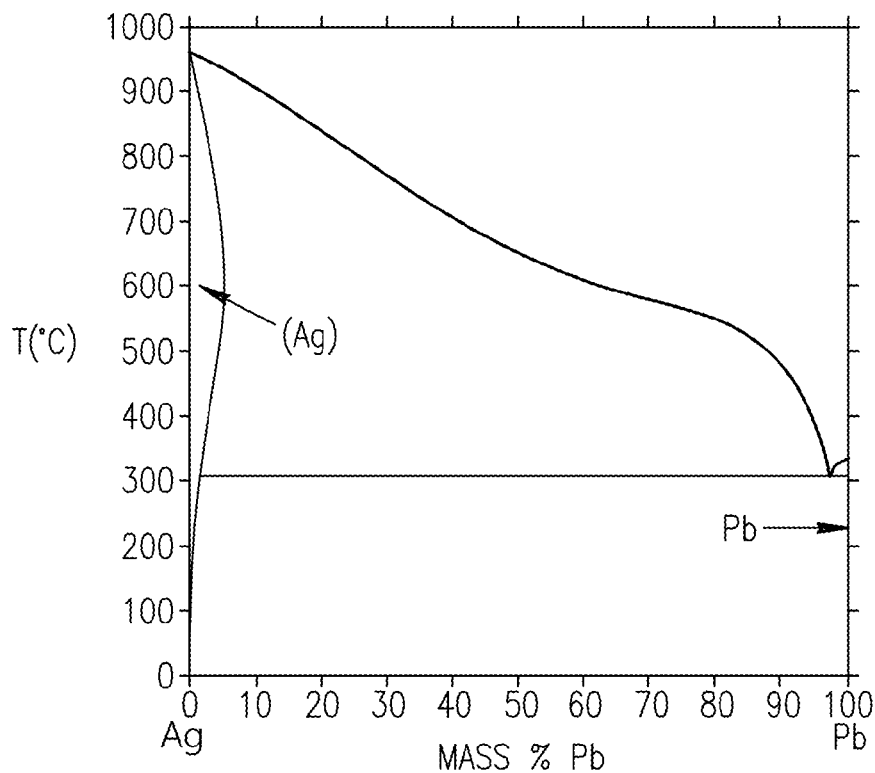
FIG. 5 is a phase diagram of Ag and Pb.

As shown in FIG. 5, ~5% of Ag is soluble with ~95% Pb at temperatures of about 360° C., while as shown in FIG. 4, 0% of Cu is soluble with Pb at temperatures of 360° C. In that regard, the nanolayer 30 of Ag is able to form an intermediate layer with the solder material 34 during the heat treatment step. By forming the intermediate layer, solder material 34 that bleeds across the die pad 34 is thereby eliminated or at least reduced.

The semiconductor chips 12 in FIG. 3D are power chips. In one embodiment, the third semiconductor chips 12C are controllers, which are coupled to dies pads 14C of the leadframe strip or matrix in a subsequent step. Thus, although not shown, semiconductor chips 12C may be coupled to remaining die pads 14C of the leadframe strip or matrix using any one of the methods discussed above. Again, to suitably adhere the semiconductor chips 12C to the die pad 14C at the microlayer 32 of Ag, the process may include a heat treating step. In that regard, the leadframe strip is exposed again to 360° C. for about 1 minute or less. It is to be appreciated that during this second heating step, the solder material 34 that adheres the semiconductor chips 12 in the first heating step will again be exposed to heat. The nanolayer 30 of Ag on the die pads 14, however, continue to restrict or limit bleeding of the solder material 34 onto the die pads as discussed above.

Figure 3E:
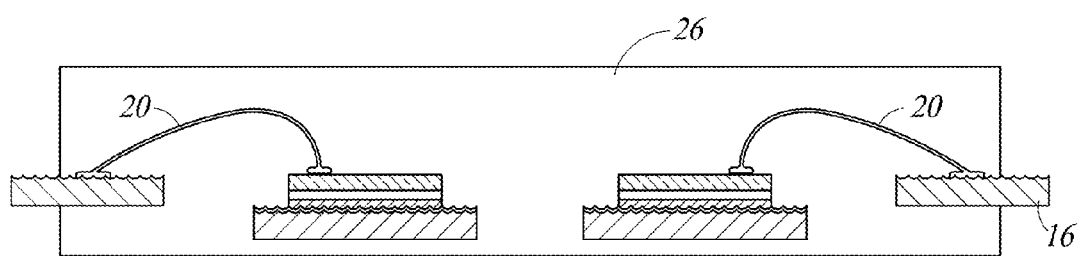

As shown in FIG. 3E, the conductive wires 20 are coupled to the die pads of the semiconductor chips 12 and to the leads 16. In particular, a first end 22 of the conductive wire 20 is coupled to a die pad of the semiconductor chips 12 and a second end 24 of the conductive wire 20 is coupled to the lead 16.

Encapsulation material 26 is then formed around the electrical components, such as the semiconductor chips 12, the conductive wires 20, and portions of the leads 16. The encapsulation material 26 may be molded around the electrical components. For instance, the leadframe strip or matrix is placed in a mold and the encapsulation material 26 is injected into the mold and flows around the electrical components. The process may include one or more curing steps for hardening the encapsulation material 26. Although not shown, in one embodiment a back surface of the die pad 14 may be exposed from the encapsulation material.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A leadframe semiconductor package comprising:
 a die pad having a roughened surface, a nanolayer of Ag on at least a portion of the roughened surface of the die pad, and a microlayer of Ag on at least a portion of the nanolayer of Ag;
 solder material on the microlayer of Ag;
 a semiconductor chip coupled to the microlayer of Ag by the solder material;
 at least one lead; and a conductive wire having a first end coupled to a bond pad of the semiconductor chip and a second end coupled to the at least one lead.

2. The leadframe semiconductor package of claim 1 wherein the die pad and at least one lead include copper or a copper alloy.

3. The leadframe semiconductor package of claim 1 wherein the nanolayer of Ag is located on the entire roughened surface of the die pad.

4. The leadframe semiconductor package of claim 1 wherein the nanolayer of Ag is approximately 10 nanometers thick.

5. The leadframe semiconductor package of claim 1 wherein the at least one lead is a plurality of leads and the nanolayer of Ag is a first nanolayer of Ag, the leadframe semiconductor package including a second nanolayer of Ag on the plurality of leads.

6. The leadframe semiconductor package of claim 1 wherein the solder material is a soft solder material.

7. The leadframe semiconductor package of claim 1 wherein the at least one lead has a roughed surface.

8. A method comprising:
   forming a nanolayer of Ag on a roughened surface of a die pad;
   forming a microlayer of Ag on the nanolayer of Ag; and
   using solder material to couple a semiconductor chip to the die pad.

9. The method of claim 8 wherein forming the nanolayer of Ag comprises plating the nanolayer of Ag.

10. The method of claim 8, further comprising roughening a surface of the die pad to form the roughened surface prior to forming the nanolayer of Ag.

11. The method of claim 8, further comprising dispensing the solder material on the microlayer of Ag, wherein using the solder material to couple the semiconductor chip to the die pad comprises reflowing the solder material.

12. The method of claim 11 wherein reflowing the solder material includes exposing the solder material to 360° C. for less than 1 minute.

13. The method of claim 12 wherein the solder material includes Pb, wherein while reflowing the solder material, the solder material forms an intermediate material that includes Ag and Pb.

14. The method of claim 8 wherein the die pad is made of copper or a copper alloy.

15. A leadframe semiconductor package comprising:
   a die pad having a roughened surface, a nanolayer of Ag located on the roughened surface;
   solder material on the die pad;
   a semiconductor chip coupled to the die pad by the solder material;
   a plurality of leads having roughened surfaces; and
   conductive wires having first ends coupled to bond pads of the semiconductor chip and second ends coupled to the plurality of leads.

16. The leadframe semiconductor package of claim 15 wherein the solder material is soft solder.

17. The leadframe semiconductor package of claim 15 wherein the nanolayer of Ag is about 10 nanometers thick.

18. The leadframe semiconductor package of claim 15, further comprising a microlayer of Ag on a portion of the nanolayer of Ag.

19. The leadframe semiconductor package of claim 15 wherein on the roughened surfaces of the plurality of leads are nanolayers of Ag.

20. The leadframe semiconductor package of claim 15 wherein outward of a perimeter of the semiconductor chip is an intermediate material formed from the solder material and the nanolayer of Ag.

* * * * *